United States Patent [19]

Yoshida et al.

[11] Patent Number: 4,615,021

[45] Date of Patent: Sep. 30, 1986

[54] SEMICONDUCTOR MEMORY DEVICE

[75] Inventors: Masanobu Yoshida, Kawaguchi; Kiyoshi Itano, Kawasaki, both of Japan

[73] Assignee: Fujitsu Limited, Kawasaki, Japan

[21] Appl. No.: 577,998

[22] Filed: Feb. 8, 1984

[30] Foreign Application Priority Data

Feb. 10, 1983 [JP] Japan .................. 58-019697

[51] Int. Cl.⁴ .............................. G11C 11/40
[52] U.S. Cl. ........................... 365/189; 365/51
[58] Field of Search ............. 365/189, 184, 51

[56] References Cited

U.S. PATENT DOCUMENTS 3,387,286  6/1968  Dennard ................... 365/189
3,702,466  11/1972  Nakagiri et al. .......... 365/51

Primary Examiner—Terrell W. Fears
Attorney, Agent, or Firm—Staas & Halsey

[57] ABSTRACT

A semiconductor memory device includes a plurality of word lines and a plurality of bit lines arranged perpendicular to each other. Memory cells are located at the cross position between each word line and each bit line, and one of the bit lines is selected by the operation of a bit line selection transistor driven by the signal of a column decoder. The bit line selection transistors are separated into a plurality of blocks corresponding to each bit line group, and the bit line selection transistors in each block are arranged along the direction of the bit line. Further, the gates of the bit line selection transistors are arranged perpendicular to the direction of the bit lines, and the gates of the bit line selection transistors are commonly connected to the gates of the corresponding bit line selection transistors in the adjoining bit line selection transistor blocks. Thus, the pitch between transistor blocks is reduced, the pattern of the bit lines is made denser, and the integration density of the semiconductor memory device is increased.

4 Claims, 4 Drawing Figures

SEMICONDUCTOR MEMORY DEVICE

BACKGROUND OF THE INVENTION (1) Field of the Invention

The present invention relates to a semiconductor memory device, more particularly to a semiconductor memory device having a pattern of arrangement of elements which reduces the pitch of bit lines.

(2) Description of the Prior Art

In a semiconductor memory device, a plurality of word lines and bit lines are arranged perpendicular to each other. Memory cells are located at the cross positions of each word line and bit line. Each word line is connected to a row decoder circuit. Each bit line is connected to a sense amplifier circuit through a bit line selection transistor. The gate of each bit line selection transistor is connected to a column decoder circuit.

Recent demand for higher density integration semiconductor memory devices has necessitated denser patterns of arrangement of word lines and bit lines. To achieve denser patterns of arrangement of bit lines, it is necessary to reduce the pitch between bit lines. To reduce the pitch between bit lines, it is necessary to reduce the space between bit line selection transistors associated with the bit lines.

SUMMARY OF THE INVENTION

An object of the present invention is to provide a semiconductor memory device, wherein the pitch between bit lines is reduced, thereby achieving a denser pattern of arrangement of bit lines and increasing the integration degree of the memory device.

According to an aspect of the present invention, there is provided a semiconductor memory device which comprises a plurality of bit line groups, each including a plurality of bit lines extending in a column direction, and a plurality of bit line selection transistor arrays each including a plurality of bit line selection transistors corresponding to the bit lines. The bit line selection transistors are separated into blocks corresponding to the bit line groups. In the device, the bit line selection transistor arrays are arranged perpendicular to the direction of the bit lines, the plurality of bit line selection transistors in each bit line selection transistor array are arranged along the direction of the bit lines, the gates of the bit line selection transistors are arranged perpendicular to the direction of the bit lines, and the connecting lines to the gates are extended to connect with the gates of the corresponding transistors in the adjoining bit line selection transistor arrays.

According to another aspect of the present invention, there is provided a semiconductor memory device which comprises a plurality of word lines, a plurality of bit lines perpendicular to the word lines, memory cells located at the cross positions of the word lines and the bit lines, bit line selection transistors connected to the bit lines for selecting one of the bit lines, and a sense amplifier connected to the bit line selection transistors. Column selection signals are supplied to the gates of the bit line selection transistors, and in the device, the plurality of bit line selection transistors are arranged along the direction of the bit lines. The gates of the bit line selection transistors are arranged perpendicular to the direction of the bit lines.

DESCRIPTION OF THE PREFERRED EMBODIMENT

Prior to the description of the preferred embodiment of the present invention, the pattern of arrangement of bit line selection transistors in a conventional semiconductor memory device will be explained for comparative purposes, with reference to FIG. 1.

Figure 1:
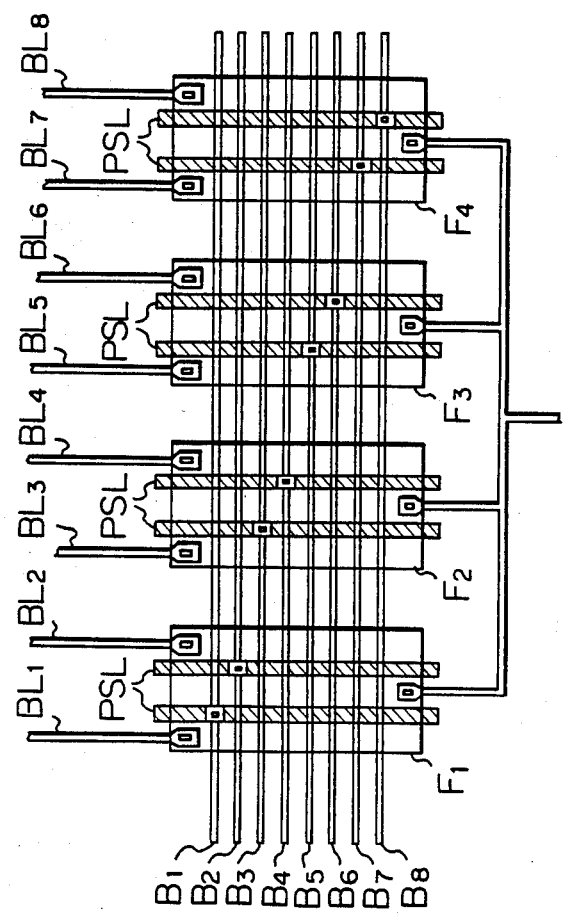
FIG. 1 is a diagram of a pattern of arrangement of bit line selection transistors in a conventional semiconductor memory device.

In FIG. 1, reference characters BL1, BL2, . . . , BL8 show bit lines, and reference characters B1, B2, . . . , B8 show decode signal lines for supplying decode signals from a column decoder circuit (not shown). Reference characters F1, F2, F3, and F4 show fields on which the bit line selection transistors are formed. The hatched portions PSL indicate a first conductor layer, for example, a polycrystalline silicon layer. Two bit line selection transistors are formed in each field. Namely, in each drawing of the fields, drains are located at the right and left ends. A common source is provided at the middle for the two transistors. The gates of the transistors are formed by the polycrystalline silicon layer PSL.

In the pattern of FIG. 1, the bit line selection transistors are arranged perpendicular to the direction of the bit lines. Therefore, the pitch between adjoining bit lines is determined by the transistor width.

Figure 2:
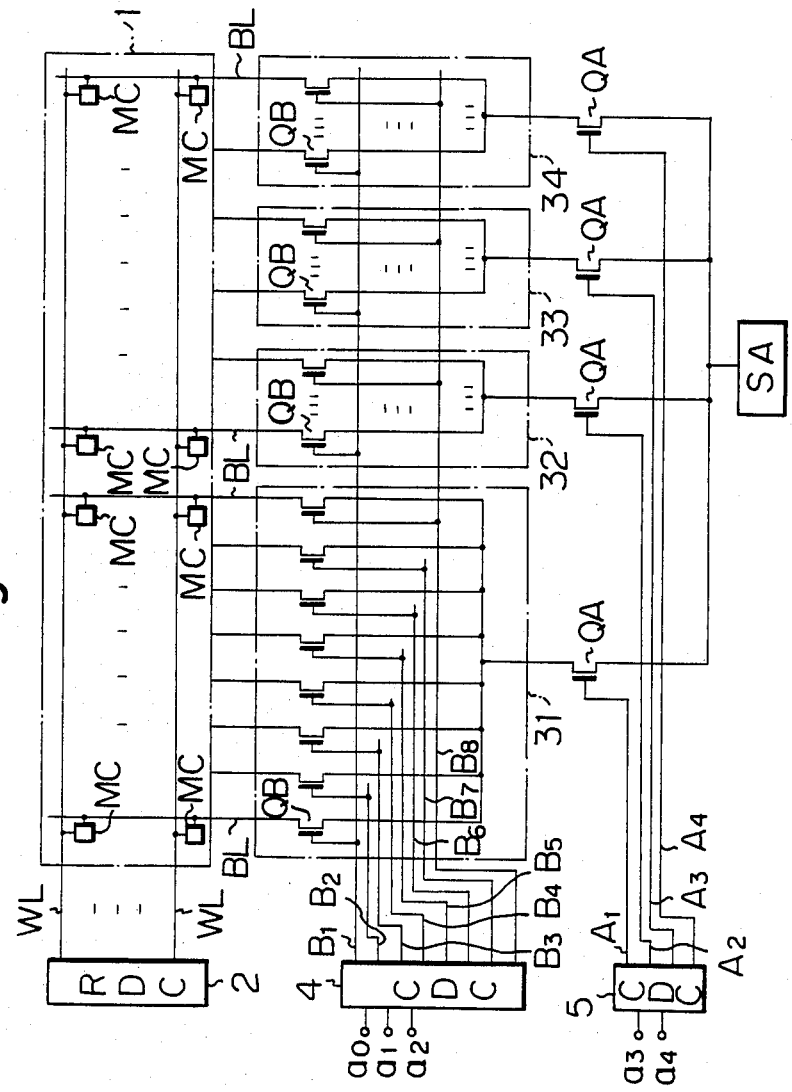
FIG. 2 is a schematic circuit diagram of a semiconductor memory device according to an embodiment of the present invention.
Figure 3:
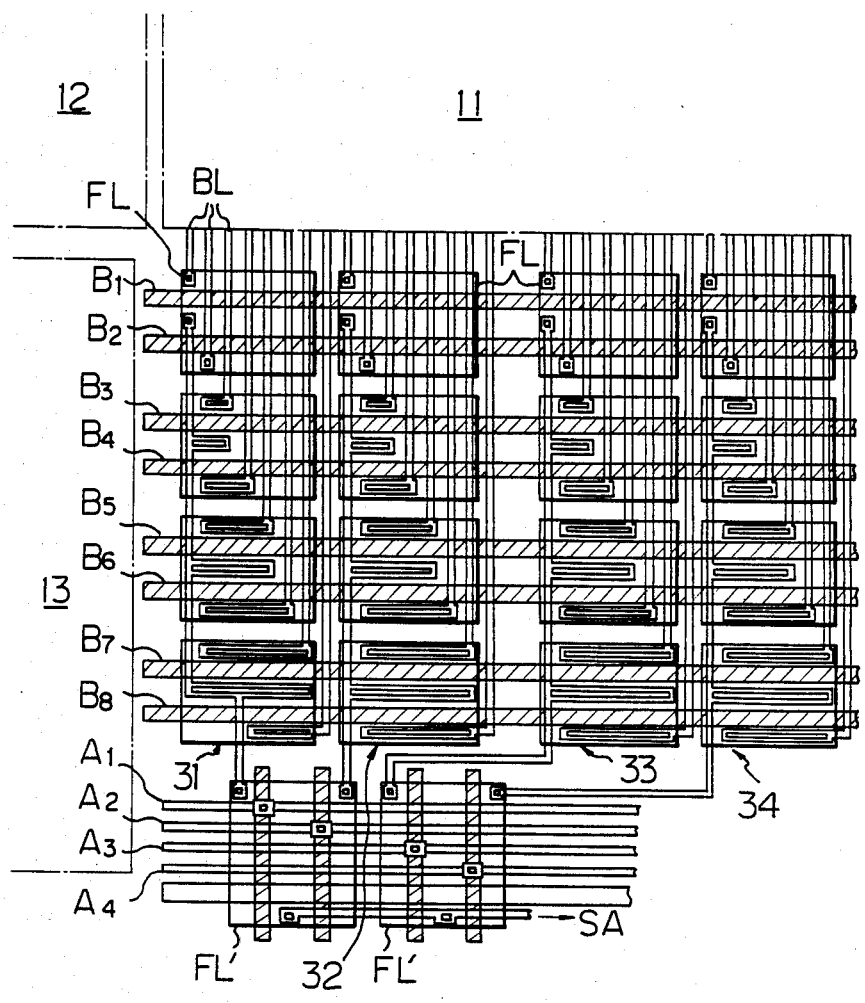
FIG. 3 is a diagram of a pattern of arrangement of bit line selection transistors for the semiconductor memory device of FIG. 2.

FIG. 2 is a schematic circuit diagram of a semiconductor memory device according to the preferred embodiment of the present invention. FIG. 3 is a diagram of a pattern of arrangement of bit line selection transistors on an integrated circuit substrate for the semiconductor memory device of FIG. 2.

The semiconductor memory device of FIG. 2 comprises a memory cell region 1; a row decoder circuit (RDC) 2; word lines WL; bit line groups, each of which includes eight bit lines; transistor blocks 31, 32, 33, and 34, serving as bit line selection transistor arrays, each of which includes eight bit line selection transistors QB corresponding to the bit lines; a first column decoder circuit (CDC) 4; a second column decoder circuit (CDC) 5; block selection transistors QA; and a sense amplifier SA.

In the memory cell region 1, the plurality of word lines and the plurality of bit lines are arranged perpendicular to each other. A memory cell is located at each cross position of the word lines WL and the bit lines BL. Each word line WL is connected to the row decoder circuit 2. Each bit line BL is connected to a bit line selection transistor QB. The bit line selection transistors QB are separated into four blocks 31, 32, 33, and 34 corresponding to the bit line groups.

The gates of the bit line selection transistors QB in each block are connected to column selection signal lines B1, B2, . . . , B8 from the first column decoder circuit 4, respectively. The first column decoder circuit 4 decodes the lower columns of address signals $a_0$, $a_1$, $a_2$ and selects one of the eight column selection signal lines B1, B2, ..., B8 to raise its potential to a high level corresponding to the pattern of the address signals $a_0$, $a_1$, $a_2$. The bit lines are connected together in each block through the bit line selection transistors QB. Each commonly connected line is connected to the sense amplifier circuit SA through the block selection transistors QA.

The gates of the block selection transistors QA are connected to block selection signal lines A1, A2, A3, A4 of the second column decoder circuit 5, respectively. The second column decoder circuit 5 decodes upper columns of address signals $a_3$, $a_4$ and selects one of the block selection signal lines A1, A2, A3, A4 to raise its potential to a high level corresponding to the pattern of the address signals $a_3$, $a_4$.

FIG. 3 is a plan view of the pattern in which the bit line selection transistors QB in the semiconductor memory device of FIG. 2, are formed. In FIG. 3, reference numeral 11 is a memory-cell forming region, 12 is a decoder-circuit forming region, and 13 is a first and second column-decoder-circuit forming region. The bit line selection transistors QB are formed in pairs in the rectangular fields FL. The bit lines from the memory-cell forming region 11 are connected to the bit selection transistors QB by an aluminum conductive pattern. The decode signal lines B1, B2, ..., B8 from the first column decoder circuit 4 are connected to the bit line selection transistors QB by the polycrystalline silicon layer, arranged perpendicular to the bit lines.

Considered three dimensionally, the polycrystalline silicon layer is provided above the transistor forming region, with a silicon dioxide $SiO_2$ insulating layer inserted therebetween. The aluminum pattern is formed above the polycrystalline silicon layer. The polycrystalline silicon layer, shown by the hatched lines, functions in the fields FL as gates of the bit line selection transistors QB.

A plurality of transistor blocks are located along the direction perpendicular to the bit lines. The eight transistors QB included in each transistor block are arranged along the direction of the bit lines, as shown in FIG. 3. The gates of the bit line selection transistors, comprised of the polycrystalline silicon and connected to the decode signal lines B1, B2, ..., B8, are extended to the gates of the corresponding bit line selection transistors in the adjoining transistor blocks. The rectangular field FL' is the field for forming the block selection transistors QA. In each field FL', two transistors QA are located.

In the pattern of FIG. 3, since the bit line selection transistors QB in each block are arranged along the direction of the bit lines, the pitch of the bit lines can be reduced to less than the width of the region forming the bit line selection transistors.

Further, in the bit line selection transistor block, the lower a bit line selection transistor is located in the figure, the less the number of crossings of the bit lines. A wider contact area between the electrode of the transistor and the bit line is possible with a bit line selection transistor having less cross over. Thus, the resistance in the electric connection can be reduced and a more reliable connection achieved.

Figure 4:
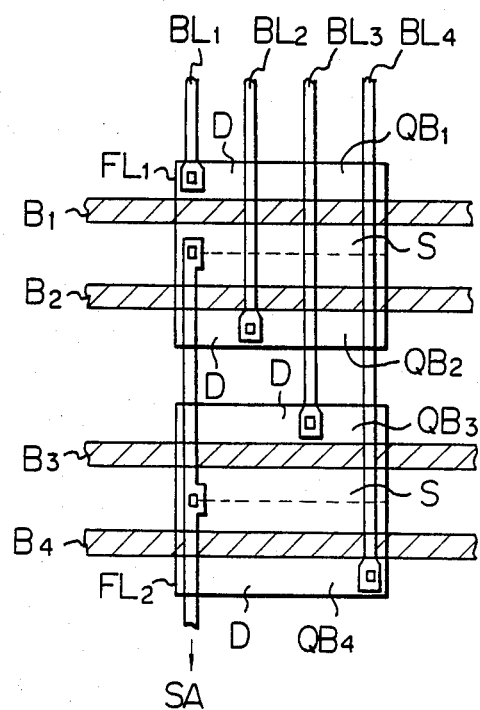
FIG. 4 is a diagram used to explain the pattern of arrangement of FIG. 3.

FIG. 4 is a diagram for explaining the elements of the transistor pattern in FIG. 3. In the figure, the drain of the bit line selection transistors QB1 to QB4 is shown by the reference character D. The source is formed in common between the bit line selection transistors QB1 and QB2 or QB3 and QB4. The source is indicated by the reference character S.

We claim:

1. A simiconductor memory device comprising:
    a plurality of bit line groups, each including a plurality of bit lines extending along a column direction; and
    a plurality of bit line selection transistor arrays, each including a plurality of bit line selection transistors corresponding to said bit lines, said bit line selection transistors having gates and drains, said bit line selection transistor arrays respectively corresponding to said bit line groups;
    said bit line selection transistor arrays being arranged substantially perpendicular to the column direction along which said bit lines extend;
    said plurality of bit line selection transistors in each of said bit line selection transistor arrays being arranged along the column direction along which said bit lines extend;
    the gates of said bit line selection transistors being arranged substantially perpendicular to the column direction along which said bit lines extend;
    the gates of said bit line selection transistors in each of said bit line selection transistor arrays being extended to connect to the gates of corresponding transistors in adjoining bit line selection transistor arrays;
    each of said bit lines being connected to the drain of the corresponding one of said bit line transistors;
    at least one of said bit lines crossing over at least one of said bit line selection transistors, other than the corresponding one of said bit line selection transistors, in each of said bit line selection transistor arrays.

2. A semiconductor memory device as set forth in claim 1, further comprising a sense amplifier operatively connected to said bit line selection transistors, wherein each of said bit line selection transistors has a source, wherein the contact area of said bit line to drain connection gradually increases in accordance with the reduced number of said bit lines crossing over said bit line selection transistors, wherein the sources of said bit line selection transistors are connected to said sense amplifier, and wherein the contact area of said source to sense amplifier connection gradually increases in accordance with the reduced number of said bit lines crossing over said bit line selection transistors.

3. A semiconductor memory device operatively connected to receive column selection signals, comprising:
    a plurality of word lines;
    a plurality of bit lines substantially perpendicular to the direction of said word lines;
    memory cells located at the cross positions of said word lines and said bit lines;
    bit line selection transistors respectively connected to said bit lines, said bit line selection transistors having drains and having gates operatively connected to receive the column selection signals, said bit line selection transistors for selecting one of said bit lines, each of said bit lines being connected to the drain of the corresponding one of said bit line selection transistors; and
    a sense amplifier connected to said bit line selection transistors;
    said bit line selection transistors being arranged along the direction of said bit lines;

the gates of said bit line selection transistors being arranged perpendicular to the direction of said bit lines;

at least one of said bit lines crossing over at least one of said bit line selection transistors other than the corresponding one of said bit line selection transistors.

4. A semiconductor memory device as set forth in claim 3, wherein each of said bit line selection transistors has a source, wherein the contact area of said bit line to drain connection gradually increases in accordance with the reduced number of said bit lines crossing over said bit line selection transistors, wherein the sources of said bit line selection transistors are connected to said sense amplifier, and wherein the contact area of said source to sense amplifier connection gradually increases in accordance with the reduced number of said bit lines crossing over said bit line selection transistors.

* * * * *